United States Patent
Kippes et al.

(10) Patent No.: US 10,840,421 B2
(45) Date of Patent: Nov. 17, 2020

(54) OPTOELECTRONIC COMPONENT AND METHOD OF OPERATING AN OPTOELECTRONIC COMPONENT

(71) Applicant: OSRAM OLED GmbH, Regensburg (DE)

(72) Inventors: Thomas Kippes, Neumarkt (DE); Jason Rajakumaran, Regensburg (DE); Ulrich Frei, Regensburg (DE); Claus Jäger, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/332,712

(22) PCT Filed: Sep. 14, 2017

(86) PCT No.: PCT/EP2017/073194
§ 371 (c)(1),
(2) Date: Mar. 12, 2019

(87) PCT Pub. No.: WO2018/050776
PCT Pub. Date: Mar. 22, 2018

(65) Prior Publication Data
US 2019/0371984 A1    Dec. 5, 2019

(30) Foreign Application Priority Data

Sep. 16, 2016 (DE) .................. 10 2016 117 523

(51) Int. Cl.
*H01L 33/60* (2010.01)
*H01L 25/075* (2006.01)
*H01L 33/58* (2010.01)

(52) U.S. Cl.
CPC .......... *H01L 33/60* (2013.01); *H01L 25/0753* (2013.01); *H01L 33/58* (2013.01)

(58) Field of Classification Search
CPC . H01L 45/1253; H01L 51/56; H01L 51/0072; H01L 45/1233; H01L 51/5056
USPC .......................................................... 257/89
See application file for complete search history.

(56) References Cited

U.S. PATENT DOCUMENTS

| | | | |
|---|---|---|---|
| 7,862,216 B2 | 1/2011 | Friedrichs et al. | |
| 2006/0056855 A1 | 3/2006 | Nakagawa et al. | |
| 2007/0051883 A1 | 3/2007 | Rains, Jr. et al. | |
| 2007/0069220 A1 | 3/2007 | Ogihara | |

(Continued)

FOREIGN PATENT DOCUMENTS

| | | |
|---|---|---|
| DE | 30 36 567 A1 | 4/1982 |
| DE | 10 2005 041 065 A1 | 8/2006 |

(Continued)

*Primary Examiner* — Andy Huynh
(74) *Attorney, Agent, or Firm* — DLA Piper LLP (US)

(57) ABSTRACT

An optoelectronic component including a first optoelectronic semiconductor chip configured to emit light includes a wavelength from an infrared spectral range, and a second optoelectronic semiconductor chip configured to emit light including a wavelength from a visible spectral range, wherein the optoelectronic component includes a reflector body including a top side and an underside, the reflector body includes a cavity opened toward the top side, a wall of the cavity constitutes a reflector, and the first optoelectronic semiconductor chip is arranged at a bottom of the cavity.

16 Claims, 6 Drawing Sheets

(56) References Cited

U.S. PATENT DOCUMENTS

| | | | |
|---|---|---|---|
| 2008/0054288 A1* | 3/2008 | Harrah | H01L 33/56 |
| | | | 257/99 |
| 2008/0137357 A1* | 6/2008 | Friedrichs | F21S 41/147 |
| | | | 362/507 |
| 2011/0242836 A1 | 10/2011 | Li | |
| 2013/0335679 A1 | 12/2013 | Tanaka et al. | |
| 2014/0117396 A1* | 5/2014 | Eisert | H01L 33/505 |
| | | | 257/98 |
| 2016/0320689 A1* | 11/2016 | Butterworth | H01L 33/58 |
| 2017/0186926 A1* | 6/2017 | Kang | H01L 33/486 |

FOREIGN PATENT DOCUMENTS

| | | |
|---|---|---|
| DE | 10 2009 015 120 A1 | 10/2010 |
| EP | 1 710 846 A1 | 10/2006 |
| JP | 2004-71902 A | 3/2004 |
| WO | 2015/101899 A1 | 7/2015 |

* cited by examiner

OPTOELECTRONIC COMPONENT AND METHOD OF OPERATING AN OPTOELECTRONIC COMPONENT

TECHNICAL FIELD

This disclosure relates to an optoelectronic component and a method of producing an optoelectronic component.

BACKGROUND

Optoelectronic components comprising radiation sources that emit in the near-infrared spectral range are known. It is known that radiation emitted by such optoelectronic components is perceptible to human observers, in particular if the radiation source is driven in pulsed operation. This may be perceived as disturbing.

SUMMARY

We provide an optoelectronic component including a first optoelectronic semiconductor chip configured to emit light including a wavelength from an infrared spectral range, and a second optoelectronic semiconductor chip configured to emit light including a wavelength from a visible spectral range, wherein the optoelectronic component includes a reflector body including a top side and an underside, the reflector body comprises a cavity opened toward the top side, a wall of the cavity constitutes a reflector, and the first optoelectronic semiconductor chip is arranged at a bottom of the cavity.

We also provide a method of operating the optoelectronic component including operating the first optoelectronic semiconductor chip in a pulsed operation, and operating the second optoelectronic semiconductor chip in a continuous operation or pulsed operation that is anticyclic with respect to the pulsed operation of the first optoelectronic semiconductor chip.

LIST OF REFERENCE SIGNS

Figure 1:
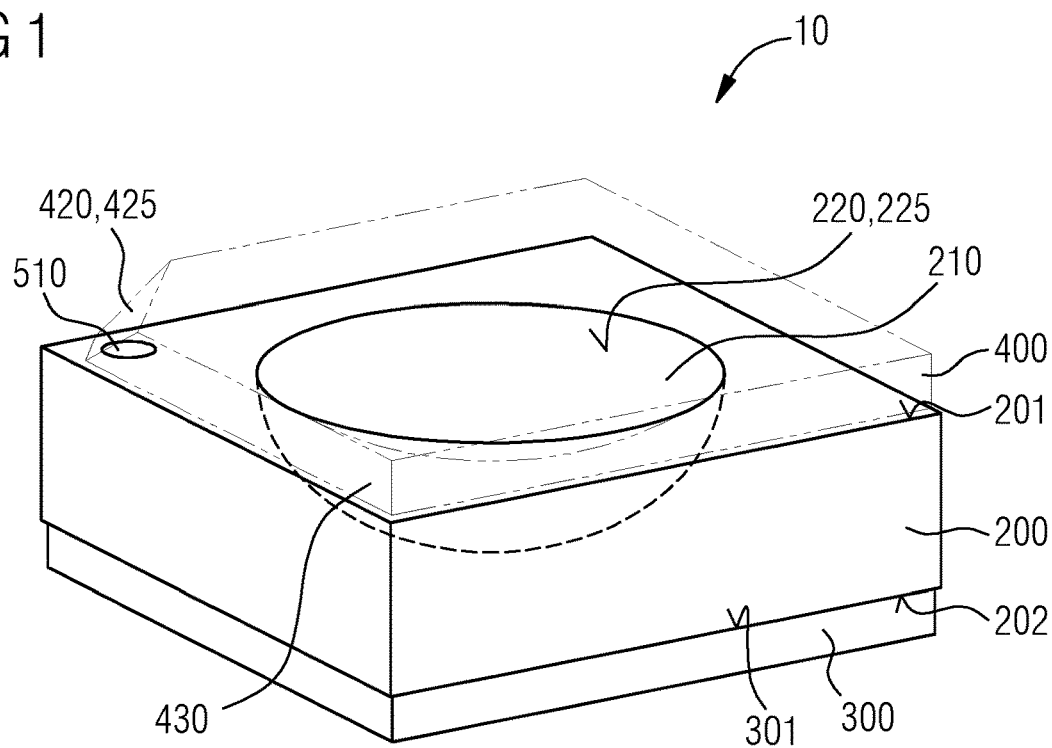
FIG. 1 shows a schematic perspective illustration of an optoelectronic component in accordance with a first example.

10 Optoelectronic component
20 Optoelectronic component
30 Optoelectronic component
40 Optoelectronic component
50 Optoelectronic component
60 Optoelectronic component
100 First optoelectronic semiconductor chip
101 Top side
102 Underside
110 Second optoelectronic semiconductor chip
111 Top side
112 Underside
120 Third optoelectronic semiconductor chip
121 Top side
122 Underside
200 Reflector body
201 Top side
202 Underside
210 Cavity
211 First section
212 Second section
213 Third section
220 Reflector
225 Wall
230 Bottom
231 First perforation
232 Second perforation
233 Third perforation
240 Channel-shaped recess
250 Recess
300 Carrier
301 Top side
400 Optical lens
410 Conical lens section
420 Deflection element
425 Reflective layer
430 Plate section
510 First optical waveguide
520 Second optical waveguide
600 Optical element
610 Light-transmissive body
611 Top side
612 Underside
613 Side face
620 Reflective coating
630 Upper microstructuring
635 Microlens
640 Lower microstructuring

DETAILED DESCRIPTION

Our optoelectronic component comprises an optoelectronic semiconductor chip configured to emit light comprising a wavelength from the infrared spectral range. The optoelectronic component additionally comprises a second optoelectronic semiconductor chip configured to emit light comprising a wavelength from the visible spectral range. Moreover, the optoelectronic component comprises a reflector body comprising a top side and an underside. The reflector body comprises a cavity open toward the top side. A wall of the cavity constitutes a reflector. The first optoelectronic semiconductor chip is arranged at a bottom of the cavity.

Advantageously, in this optoelectronic component, light emitted by the second optoelectronic semiconductor chip and comprising a wavelength from the visible spectral range may mask, that is to say conceal, light emitted by the first optoelectronic semiconductor chip and comprising a wavelength from the infrared spectral range for a human observer. As a result, light emitted by the first optoelectronic semiconductor chip and comprising a wavelength from the infrared spectral range is not perceived as disturbing by an observer.

The reflector body may comprise, at a bottom of the cavity, a first perforation extending between the underside of the reflector body and the cavity. In this example, the first optoelectronic semiconductor chip is arranged in the first perforation. Advantageously, the reflector body may be constructed simply and cost-effectively as a result. In this example, an electrical contacting of the first optoelectronic semiconductor chip may be carried out from below the reflector body.

The optoelectronic component may comprise a carrier. In this example, the reflector body is arranged on the carrier such that the underside of the reflector body faces the carrier. The first optoelectronic semiconductor chip may be arranged on the carrier. Advantageously, the carrier enables a simple electrical contacting of the first optoelectronic semiconductor chip of the optoelectronic component. As a result, the optoelectronic component is advantageously producible simply, cost-effectively and with compact external dimensions.

The cavity may widen in a funnel-shaped fashion toward the top side of the reflector body. Advantageously, the reflector constituted of the wall of the cavity may thereby focus light emitted by the first optoelectronic semiconductor chip of the optoelectronic component and comprising a wavelength from the infrared spectral range. By way of example, light emitted by the first optoelectronic semiconductor chip may be focused to form a parallel beam by the reflector of the optoelectronic component.

The optoelectronic component may comprise an optical lens arranged at the top side of the reflector body. Advantageously, the optical lens may bring about a beam shaping of the light emitted by the first optoelectronic semiconductor chip of the optoelectronic component and comprising a wavelength from the infrared spectral range. By way of example, light emitted by the first optoelectronic semiconductor chip may be focused into a defined spatial region by the optical lens of the optoelectronic component.

The lens may comprise a conical lens section extending into the cavity of the reflector body. Advantageously, this results in a particularly compact and robust design of the optoelectronic component.

The optoelectronic component may comprise an optical waveguide extending through the reflector body from the underside of the reflector body to the top side of the reflector body. In this example, the reflector body is arranged above the second optoelectronic semiconductor chip such that light emitted by the second optoelectronic semiconductor chip passes into the optical waveguide at the underside of the reflector body. Light may emerge from the optical waveguide at the top side of the reflector body. Advantageously, the optical waveguide makes it possible to guide the light emitted from the second optoelectronic semiconductor chip to the top side of the reflector body.

A deflection element may be arranged above the top side of the reflector body such that light emerging from the optical waveguide is deflected into the optical lens. Advantageously, in this optoelectronic component, the optical lens may bring about a mixing of the light emitted by the first optoelectronic semiconductor chip of the optoelectronic component and comprising a wavelength from the infrared spectral range with the light emitted by the second optoelectronic semiconductor chip of the optoelectronic component and comprising a wavelength from the visible spectral range. In this example, a good intermixing of the light may be achieved by internal reflections in the optical lens of the optoelectronic component. Advantageously, an effective masking of the light comprising a wavelength from the infrared spectral range may be achieved by a good intermixing of the light comprising a wavelength from the infrared spectral range and the light comprising a wavelength from the visible spectral range.

The deflection element may be constituted of a reflective layer arranged at the optical lens. As a result, the optoelectronic component comprises a particularly simple construction comprising only a small number of individual component parts, as a result of which it is advantageously producible simply, rapidly and cost-effectively.

The underside of the reflector body may be arranged above a top side of the second optoelectronic semiconductor chip. This advantageously prevents light emitted by the second optoelectronic semiconductor chip and comprising a wavelength from the visible spectral range from passing on a direct path to a human observer. Otherwise, the second optoelectronic semiconductor chip would be recognizable as a separate light source spaced apart from the first optoelectronic semiconductor chip, which might be accompanied by only incomplete masking of the light emitted by the first optoelectronic semiconductor chip and comprising a wavelength from the infrared spectral range. What is achieved by arranging the underside of the reflector body above the top side of the second optoelectronic semiconductor chip is that light emitted by the second optoelectronic semiconductor chip and comprising a wavelength from the visible spectral range mixes with light emitted by the first optoelectronic semiconductor chip and comprising a wavelength from the infrared spectral range before it reaches an observer.

A channel-shaped recess may be formed at the underside of the reflector body. In this example, the first perforation extends to the channel-shaped recess. The second optoelectronic semiconductor chip is arranged in the channel-shaped recess. What is achieved as a result is that light emitted by the second optoelectronic semiconductor chip and comprising a wavelength from the visible spectral range may pass through the channel-shaped recess to the first perforation and the first optoelectronic semiconductor chip arranged there, where it may mix with light emitted by the first optoelectronic semiconductor chip and comprising a wavelength from the infrared spectral range. An effective masking of the light emitted by the first optoelectronic semiconductor chip by the light emitted by the second optoelectronic semiconductor chip is advantageously achieved as a result.

The second optoelectronic semiconductor chip may be arranged at the bottom of the cavity. Advantageously, a mixing of the light emitted by the first optoelectronic semiconductor chip and the light emitted by the second optoelectronic semiconductor chip may be carried out in the cavity of the optoelectronic component as a result.

The reflector body may comprise a second perforation extending between the underside of the reflector body and the cavity. In this example, the second optoelectronic semiconductor chip is arranged in the second perforation. Light emitted by the second optoelectronic semiconductor chip and comprising a wavelength from the visible spectral range, in the reflector constituted by the wall of the cavity, may mix with light emitted by the first optoelectronic semiconductor chip and comprising a wavelength from the infrared spectral range to mask the latter light.

The cavity may comprise a first section widening in a funnel-shaped fashion toward the top side of the reflector body, and a second section widening in a funnel-shaped fashion toward the top side of the reflector body. In this example, the first section and the second section are superimposed on one another. The first perforation is arranged at the bottom of the first section of the cavity. The second perforation is arranged at the bottom of the second section of the cavity. Advantageously, the reflector constituted by the wall of the cavity, given this shaping of the cavity, may bring about a particularly effective intermixing of the light emitted by the second optoelectronic semiconductor chip with the light emitted by the first optoelectronic semiconductor chip.

The optoelectronic component may comprise an optical element arranged in the cavity such that light emitted by the first optoelectronic semiconductor chip and light emitted by the second optoelectronic semiconductor chip at least partly pass into the optical element. In this example, the optical element is configured to mix light emitted by the first optoelectronic semiconductor chip and light emitted by the second optoelectronic semiconductor chip. Advantageously, the optical element of this optoelectronic component may bring about an intermixing of the light emitted by the first optoelectronic semiconductor chip and the light emitted by the second optoelectronic semiconductor chip and, as a result, a masking of the light emitted by the first optoelectronic semiconductor chip and comprising a wavelength from the infrared spectral range.

The optical element may comprise a light-transmissive body comprising a top side and an underside. In this example, a reflective coating is arranged at least in sections at side faces of the light-transmissive body extending between the top side and the underside. In this optoelectronic component, an intermixing of the light emitted by the first optoelectronic semiconductor chip and the light emitted by the second optoelectronic semiconductor chip is achieved by single or multiple reflection of the light that has progressed in the light-transmissive body of the optical element at the side faces of the light-transmissive body.

The top side of the light-transmissive body may comprise a micro structuring. The microstructuring may advantageously facilitate a coupling-out of the light that has radiated into the light-transmissive body of the optical element at the top side of the light-transmissive body. As a result, light that has radiated into the light-transmissive body of the optical element is advantageously substantially radiated out at the top side of the light-transmissive body.

The microstructuring may comprise a plurality of microlenses. In this example, the microlenses may be arranged, for example, in a two-dimensional matrix arrangement. Advantageously, the microstructuring then brings about a coupling-out of light at the top side of the light-transmissive body of the optical element and at the same time a beam shaping of the light coupled out at the top side of the light-transmissive body.

The underside of the light-transmissive body may comprise a microstructuring. Advantageously, the microstructuring arranged at the underside of the light-transmissive body of the optical element supports an intermixing of the light emitted by the first optoelectronic semiconductor chip and the light emitted by the second optoelectronic semiconductor chip in the light-transmissive body of the optical element.

The second optoelectronic semiconductor chip may be arranged at the bottom of the cavity. In this example, the light-transmissive body is arranged above the first optoelectronic semiconductor chip and above the second optoelectronic semiconductor chip. The underside of the light-transmissive body faces the first optoelectronic semiconductor chip and the second optoelectronic semiconductor chip. As a result, light emitted by the first optoelectronic semiconductor chip and by the second optoelectronic semiconductor chip, in this optoelectronic component, is introduced into the light-transmissive body of the optical element at the underside of the light-transmissive body, where it experiences an intermixing.

The light-transmissive body may be arranged above the first optoelectronic semiconductor chip. In this example, the underside of the light-transmissive body faces the first optoelectronic semiconductor chip. The second optoelectronic semiconductor chip is arranged laterally next to the light-transmissive body. In this example, a radiation emission side of the second optoelectronic semiconductor chip faces a side face of the light-transmissive body. In this optoelectronic component, light emitted by the first optoelectronic semiconductor chip and comprising a wavelength from the infrared spectral range is introduced into the light-transmissive body at the underside of the light-transmissive body of the optical element. Light emitted by the second optoelectronic semiconductor chip and comprising a wavelength from the visible spectral range is introduced into the light-transmissive body of the optical element from the side through one of the side faces of the light-transmissive body. In the light-transmissive body of the optical element, the light emitted by the first optoelectronic semiconductor chip and the light emitted by the second optoelectronic semiconductor chip are mixed with one another.

The second optoelectronic semiconductor chip may be arranged on a top side of the first optoelectronic semiconductor chip. Advantageously, the light emitted by the first optoelectronic semiconductor chip and comprising a wavelength from the infrared spectral range and the light emitted by the second optoelectronic semiconductor chip and comprising a wavelength from the visible spectral range, in this arrangement, are radiated from source locations lying very close to one another, thus resulting in a particularly good intermixing of the light comprising a wavelength from the infrared spectral range and the light comprising a wavelength from the visible spectral range. A further advantage is that the arrangement of the second optoelectronic semiconductor chip on the top side of the first optoelectronic semiconductor chip is particularly space-saving, as a result of which the optoelectronic component may be configured in a compact fashion.

A top side of the second optoelectronic semiconductor chip may comprise a smaller size than the top side of the first optoelectronic semiconductor chip. Advantageously, as a result, only a small part of the light-emitting top side of the first optoelectronic semiconductor chip is covered by the second optoelectronic semiconductor chip. As a result, the light emitted by the first optoelectronic semiconductor chip and comprising a wavelength from the infrared spectral range is not shaded, or shaded only to a small extent, by the second optoelectronic semiconductor chip. It is also possible for the second optoelectronic semiconductor chip to be arranged on a non-light-emitting section of the top side of the first optoelectronic semiconductor chip.

The second optoelectronic semiconductor chip may be at least partly transparent to light emitted by the first optoelectronic semiconductor chip. Advantageously, the light emitted by the first optoelectronic semiconductor chip and comprising a wavelength from the infrared spectral range is then not shaded, or shaded only to a small extent, by the second optoelectronic semiconductor chip arranged on the top side of the first optoelectronic semiconductor chip.

The second optoelectronic semiconductor chip may be configured as a volume emitting semiconductor chip. This advantageously facilitates mixing the light emitted by the second optoelectronic semiconductor chip and comprising a wavelength from the visible spectral range with the light emitted by the first optoelectronic semiconductor chip and comprising a wavelength from the infrared spectral range.

The second optoelectronic semiconductor chip may be configured to emit light comprising a wavelength from the red spectral range. Advantageously, the light emitted by the second optoelectronic semiconductor chip thereby brings about a particularly effective optical masking of the light emitted by the first optoelectronic semiconductor chip and comprising a wavelength from the infrared spectral range.

The optoelectronic component may comprise a third optoelectronic semiconductor chip configured to emit light comprising a wavelength from the visible spectral range. In this optoelectronic component, the light emitted by the third optoelectronic semiconductor chip and comprising a wavelength from the visible spectral range also conceals the light emitted by the first optoelectronic semiconductor chip and comprises a wavelength from the infrared spectral range, to prevent a human observer from perceiving as disturbing the light emitted by the first optoelectronic semiconductor chip and comprising a wavelength from the infrared spectral range.

In a method of operating an optoelectronic component of the type mentioned above, the first optoelectronic semiconductor chip is operated in pulsed operation. The second optoelectronic semiconductor chip is operated in continuous operation or pulsed operation that is anticyclic with respect to the pulsed operation of the first optoelectronic semiconductor chip. Advantageously, in the optoelectronic component operated according to this method, the radiation—taking place in pulses—of light comprising a wavelength from the infrared spectral range by the first optoelectronic semiconductor chip is not perceived as disturbing by a human observer since the pulsation of the light radiated by the first optoelectronic semiconductor chip and comprising a wavelength from the infrared spectral range is concealed in the observer's perception by the light radiated by the second optoelectronic semiconductor chip and comprising a wavelength from the visible spectral range.

The above-described properties, features and advantages and the way in which they are achieved will become clearer and more clearly understood in association with the following description of examples explained in greater detail in association with the drawings.

FIG. 1 shows a schematic perspective illustration of an optoelectronic component 10 in accordance with a first example. The optoelectronic component 10 is configured to emit light comprising a wavelength from the infrared spectral range. The optoelectronic component 10 may be configured, for example, to radiate the infrared light in pulsed operation, for example, in pulsed operation comprising a frequency of a few pulses per second.

The optoelectronic component 10 comprises a reflector body 200, a carrier 300 and an optical lens 400. The reflector body 200 is arranged at a top side 301 of the carrier 300 in such a way that an underside 202 of the reflector body 200 faces the top side 301 of the carrier 300. The optical lens 400 is arranged above a top side 201 of the reflector body 200 opposite the underside 202.

Figure 2:
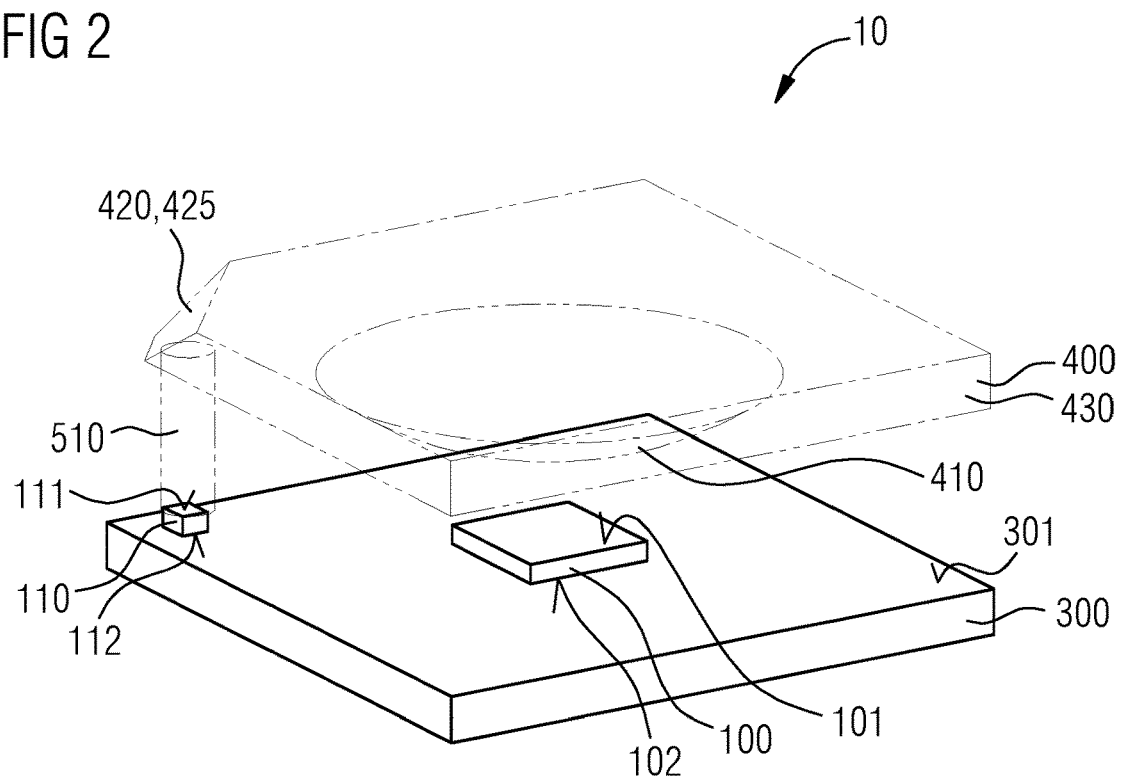
FIG. 2 schematically shows a perspective illustration of parts of the optoelectronic component of the first example.
Figure 3:
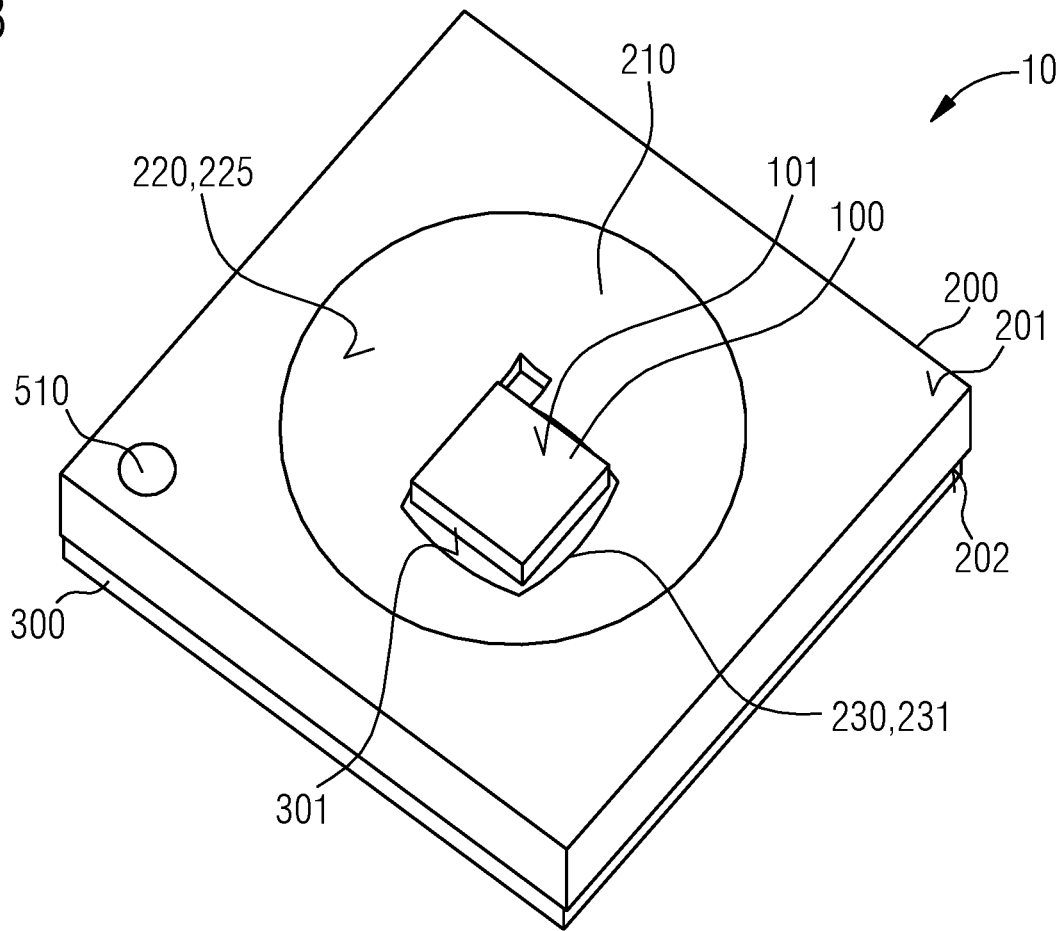
FIG. 3 schematically shows a further perspective illustration of parts of the optoelectronic component of the first example.
Figure 4:
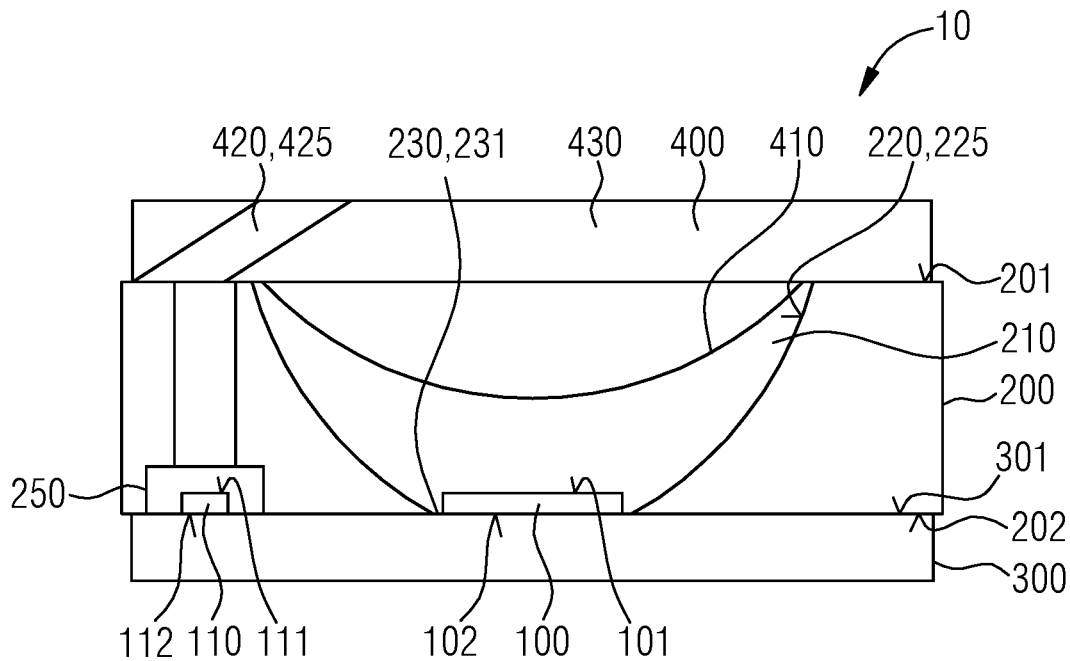
FIG. 4 schematically shows a sectional side view of the optoelectronic component in accordance with the first example.

FIG. 2 shows a schematic perspective view of the optoelectronic component 10 in which the reflector body 200 is not illustrated. FIG. 3 shows a schematic perspective view of the optoelectronic component 10 in which the optical lens 400 is not illustrated. FIG. 4 shows a schematic sectional side view of the optoelectronic component 10.

The reflector body 200 of the optoelectronic component 10 comprises a parallelepipedal basic shape. The reflector body 200 may be formed from a plastics material, for example.

The reflector body 200 comprises a cavity 210 open toward the top side 201. The cavity 210 is visible in the illustrations in FIGS. 3 and 4. The cavity 210 widens toward the top side 201 of the reflector body 200, for example in a funnel-shaped fashion or conically. A wall 225 of the cavity 210 constitutes a reflector 220. The wall 225 of the cavity 210 of the reflector body 200 may comprise a reflective coating, for example a metallic coating.

At a bottom 230 of the cavity 210, that is to say in the base region of the cavity 210, the reflector body 200 comprises a first perforation 231. This is discernible in FIGS. 3 and 4. The first perforation 231 extends between the underside 202 of the reflector body 200 and the cavity 210.

The optoelectronic component 10 comprises a first optoelectronic semiconductor chip 100. The first optoelectronic semiconductor chip 100 is configured to emit light comprising a wavelength from the infrared spectral range. The first optoelectronic semiconductor chip 100 may be configured, for example, to emit light comprising a wavelength from the near-infrared spectral range, for example, light comprising a wavelength of 810 nm or light comprising a wavelength of 850 nm. The first optoelectronic semiconductor chip 100 may be, for example, a light-emitting diode chip (LED chip).

The first optoelectronic semiconductor chip 100 comprises a top side 101 and an underside 102 opposite the top side 101. The top side 101 of the first optoelectronic semiconductor chip 100 constitutes a radiation emission side of the first optoelectronic semiconductor chip 100. Light generated by the first optoelectronic semiconductor chip 100 is at least partly radiated at the top side 101 of the first optoelectronic semiconductor chip 100.

The first optoelectronic semiconductor chip 100 of the optoelectronic component 10 is arranged in the first perforation 231 of the reflector body 200. In this example, the top side 101 of the first optoelectronic semiconductor chip 100 is oriented in the direction of the top side 201 of the reflector body 200. This is discernible in FIGS. 3 and 4. As a result, light radiated from the first optoelectronic semiconductor chip 100 at the top side 101 thereof and comprising a wavelength from the infrared spectral range may be collected and focused by the reflector 220 of the reflector body 200 and emerge from the cavity 210 at the top side 201 of the reflector body 200.

The carrier 300 of the optoelectronic component 10 may be configured as a circuit board, for example. Electrical contact pads and electrical conductor tracks for electrically contacting the first optoelectronic semiconductor chip 100 may be arranged at the top side 301 of the carrier 300. The first optoelectronic semiconductor chip 100 is arranged at the top side 301 of the carrier 300 such that its underside 102 faces the top side 301 of the carrier 300. In this example, the first optoelectronic semiconductor chip 100 is electrically conductively connected to electrical contact pads at the top side 301 of the carrier 300.

The reflector body 200 is also arranged at the top side 301 of the carrier 300. In this example, the underside 202 of the reflector body 200 faces the top side 301 of the carrier 300. The reflector body 200 and the first optoelectronic semiconductor chip 100 are arranged at the top side 301 of the carrier 300 such that the first optoelectronic semiconductor chip 100 is arranged in the first perforation 231 of the reflector body 200.

The optical lens 400 of the optoelectronic component 10, the optical lens merely being illustrated schematically in FIGS. 1 to 4, is provided to shape light radiated from the first optoelectronic semiconductor chip 100 and emerges from the cavity 210 at the top side 201 of the reflector body 200, for example, to focus the light into a spatial region in the vicinity of the optoelectronic component 10. In the example shown in FIGS. 1 to 4, the optical lens 400 comprises a plate section 430 and a conical lens section 410. The plate section 430 of the optical lens 400 is formed substantially in a parallelepipedal fashion and arranged at the top side 201 of the reflector body 200. The conical lens section 410 is arranged centrally at a surface of the plate section 430 of the optical lens 400 facing the top side 201 of the reflector body 200 and extends into the cavity 210 of the reflector body 200.

Light emitted by the first optoelectronic semiconductor chip 100 of the optoelectronic component 10 and comprising a wavelength from the infrared spectral range may be perceptible to a human observer as a weakly visible red glow. If the first optoelectronic semiconductor chip 100 of the optoelectronic component 10 is driven in pulsed operation, that is to say if the first optoelectronic semiconductor chip 100 is switched on and off alternately, the flashing of the red glow may be perceived as disturbing. Therefore, in the optoelectronic component 10, provision is made for masking, that is to say concealing, the light emitted by the first optoelectronic semiconductor chip 100 and comprising a wavelength from the infrared spectral range by light comprising a wavelength from the visible spectral range.

For this purpose, the optoelectronic component 10 comprises a second optoelectronic semiconductor chip 110. The second optoelectronic semiconductor chip 110 is configured to emit light comprising a wavelength from the visible spectral range. By way of example, the second optoelectronic semiconductor chip 110 may be configured to emit light comprising a wavelength from the red spectral range. The second optoelectronic semiconductor chip 110 may be a light-emitting diode chip (LED chip), for example.

The second optoelectronic semiconductor chip comprises a top side 111 and an underside 112 opposite the top side 111. The second optoelectronic semiconductor chip 110 may be configured to radiate light only at the top side 111. However, the second optoelectronic semiconductor chip 110 may also be configured as a volume emitting semiconductor chip. In this example, the second optoelectronic semiconductor chip 110 radiates light not only at the top side 111, but also at side faces of the optoelectronic semiconductor chip 110 extending between the top side 111 and the underside 112.

The second optoelectronic semiconductor chip 110 of the optoelectronic component 10 is arranged at the top side 301 of the carrier 300 below the reflector body 200. In this example, the underside 112 of the second optoelectronic semiconductor chip 110 faces the top side 301 of the carrier 300. The reflector body 200 may comprise a recess 250 at its underside 202, the second optoelectronic semiconductor chip 110 being arranged in the recess. This is discernible in FIG. 4. The second optoelectronic semiconductor chip 110 is electrically contacted via electrical contact pads and conductor tracks arranged at the top side 301 of the carrier 300.

The optoelectronic component 10 comprises a first optical waveguide 510 extending through the reflector body 200. In this example, the first optical waveguide 510 extends from the recess 250 at the underside 202 of the reflector body 200 to the top side 201 of the reflector body 200. The first optical waveguide 510 is thus arranged such that light emitted by the second optoelectronic semiconductor chip 110 passes into the optical waveguide 510 at the underside 202 of the reflector body 200 and is guided through the optical waveguide 510 to the top side 201 of the reflector body 200. At the top side 201 of the reflector body 200, the light emitted by the second optoelectronic semiconductor chip 110 may emerge from the first optical waveguide 510.

The optical lens 400 of the optoelectronic component 10 comprises a deflection element 420. The deflection element 420 is constituted of a reflective layer 425 arranged at a chamfered corner of the plate section 430 of the optical lens 400.

Light emitted by the second optoelectronic semiconductor chip 110 and passes through the first optical waveguide 510 emerges from the first optical waveguide 510 at the top side 201 of the reflector body 200 and enters the plate section 430 of the optical lens 400. The deflection element 420 of the optical lens 400 is arranged such that the light emitted by the second optoelectronic semiconductor chip 110 and comprising a wavelength from the visible spectral range is reflected at the reflective layer 425 of the deflection element 420 and thereby deflected into the optical lens 400. The light deflected into the optical lens 400 and comprising a wavelength from the visible spectral range may be subjected to reflection, for example, total internal reflection, even more times within the optical lens 400 and finally emerge from the optical lens at the top side of the optical lens 400 facing away from the reflector body 200.

While the light emitted by the second optoelectronic semiconductor chip 110 and comprising a wavelength from the visible spectral range passes through the optical lens 400, it is at least partly intermixed with the light emitted by the first optoelectronic semiconductor chip 100 and comprising a wavelength from the infrared spectral range. In the light radiated from the optoelectronic component 10, therefore, light emitted by the first optoelectronic semiconductor chip 100 and comprising a wavelength from the infrared spectral range and light emitted by the second optoelectronic semiconductor chip 110 and comprising a wavelength from the visible spectral range are superimposed. As a result, the light emitted by the first optoelectronic semiconductor chip 100 and comprising a wavelength from the infrared spectral range is not visible or hardly visible to a human observer.

Figure 5:
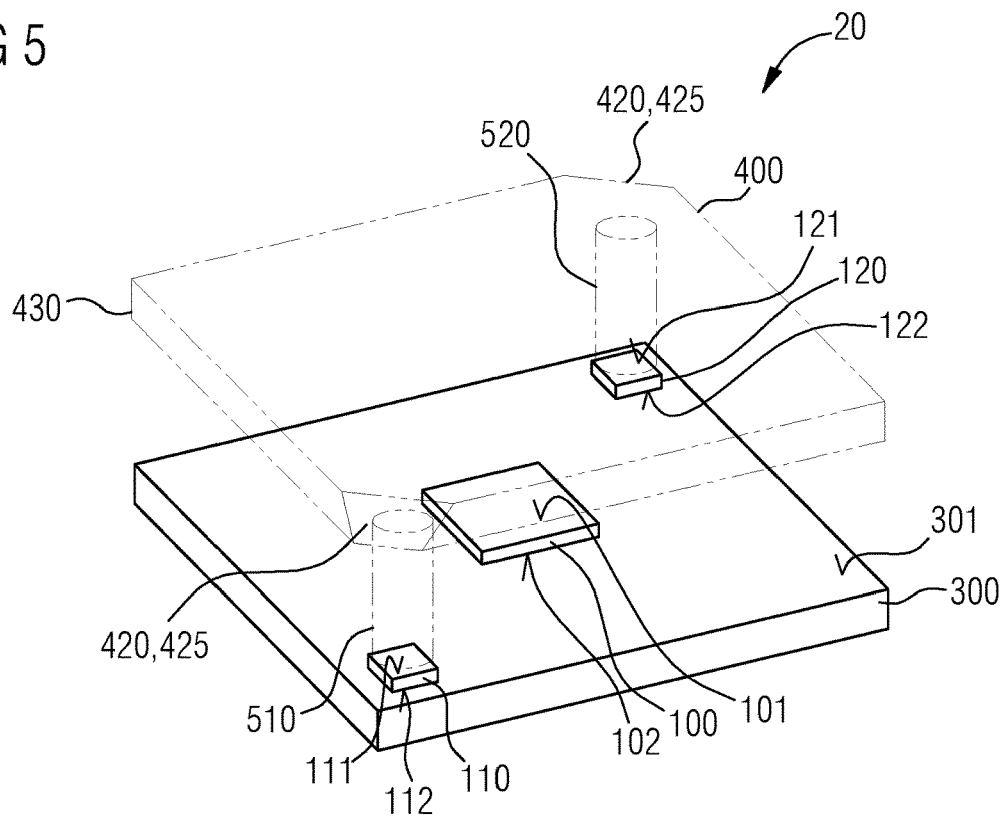
FIG. 5 schematically shows a perspective illustration of parts of an optoelectronic component of a second example.

FIG. 5 shows a schematic perspective illustration of part of an optoelectronic component 20 in accordance with a second example. The optoelectronic component 20 of the second example largely corresponds to the optoelectronic component 10 of the first example. Mutually corresponding component parts are provided with the same reference signs in FIGS. 1 to 4 and in FIG. 5. Only the differences are described below. For the rest, the above description of the optoelectronic component 10 of the first example also applies to the optoelectronic component 20 of the second example shown in FIG. 5.

The reflector body 200 of the optoelectronic component 20 is not shown in the schematic illustration in FIG. 5, for the sake of clarity.

The optoelectronic component 20 comprises a third optoelectronic semiconductor chip 120 in addition to the second optoelectronic semiconductor chip 110. The third optoelectronic semiconductor chip 120 is likewise configured to emit light comprising a wavelength from the visible spectral range. The third optoelectronic semiconductor chip 120 may be configured for example to emit light comprising the same wavelength as the second optoelectronic semiconductor chip 110. The third optoelectronic semiconductor chip 120 may be configured like the second optoelectronic semiconductor chip 110.

The third optoelectronic semiconductor chip 120 comprises a top side 121 and an underside 122 opposite the top side 121. The third optoelectronic semiconductor chip 120 is arranged at the top side 301 of the carrier 300 such that the underside 122 of the third optoelectronic semiconductor chip 120 faces the top side 301 of the carrier 300. In this example, the third optoelectronic semiconductor chip 120 is electrically contacted via electrical contact pads and conductor tracks arranged at the top side 301 of the carrier 300. The third optoelectronic semiconductor chip 120 is arranged below the reflector body 200, for example, in a further recess arranged at the underside 202 of the reflector body 200. In the example illustrated, the first optoelectronic semiconductor chip 100 is arranged centrally between the second optoelectronic semiconductor chip 110 and the third optoelectronic semiconductor chip 120.

The optoelectronic component 20 comprises a second optical waveguide 520 in addition to the first optical waveguide 510. The second optical waveguide 520 is configured like the first optical waveguide 510. The second optical waveguide 520 is arranged such that light emitted by the third optoelectronic semiconductor chip 120 and comprising a wavelength from the visible spectral range may pass into the optical waveguide 520 at the underside 202 of the reflector body 200 and emerge from the second optical waveguide 520 at the top side 201 of the reflector body 200.

Besides the deflection element 420 provided for deflecting the light emitted by the second optoelectronic semiconductor chip 110 into the optical lens 400, the optoelectronic component 20 comprises a further deflection element 420, which deflects the light emitted by the third optoelectronic semiconductor chip 120 into the optical lens 400.

Thus, in the optoelectronic component 20, the light emitted by the first optoelectronic semiconductor chip 100 and comprising a wavelength from the infrared spectral range is superimposed and masked both by the light emitted by the second optoelectronic semiconductor chip 110 and the light emitted by the third optoelectronic semiconductor chip 120 and comprising a wavelength from the visible spectral range. It is possible to provide even further optoelectronic semiconductor chips configured to emit light comprising a wavelength from the visible spectral range provided to superimpose on and mask the light emitted by the first optoelectronic semiconductor chip 100.

The deflection elements 420 may be omitted both of the optoelectronic component 10 of the first example and the optoelectronic component 20 in accordance with the second example.

Figure 6:
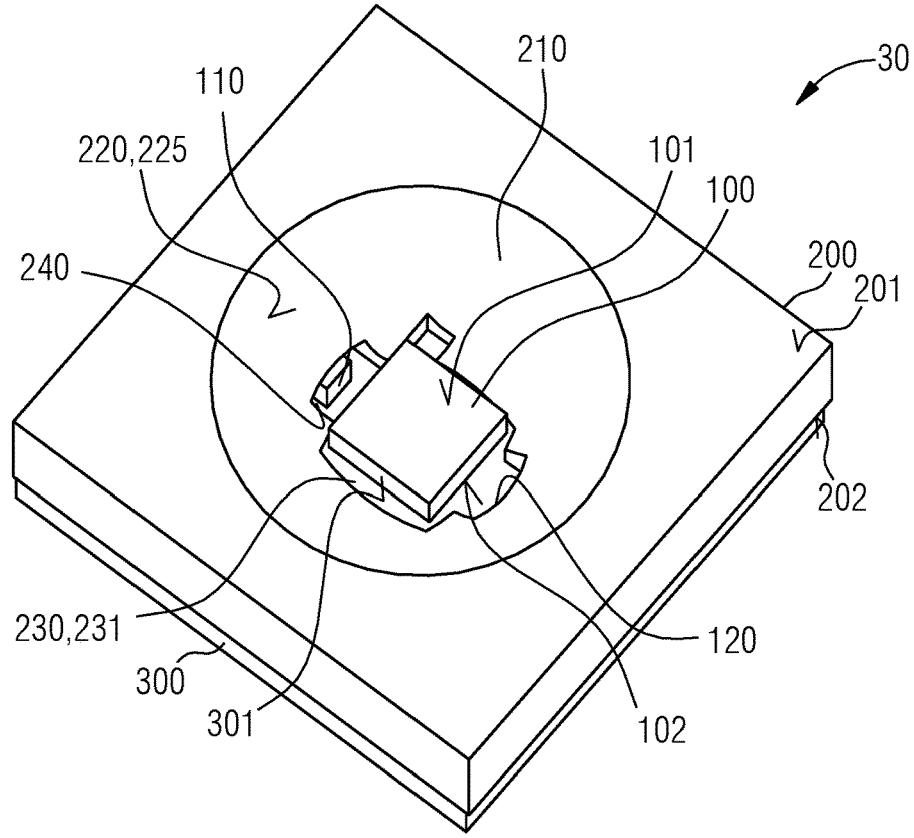
FIG. 6 schematically shows a perspective illustration of parts of an optoelectronic component of a third example.
Figure 7:
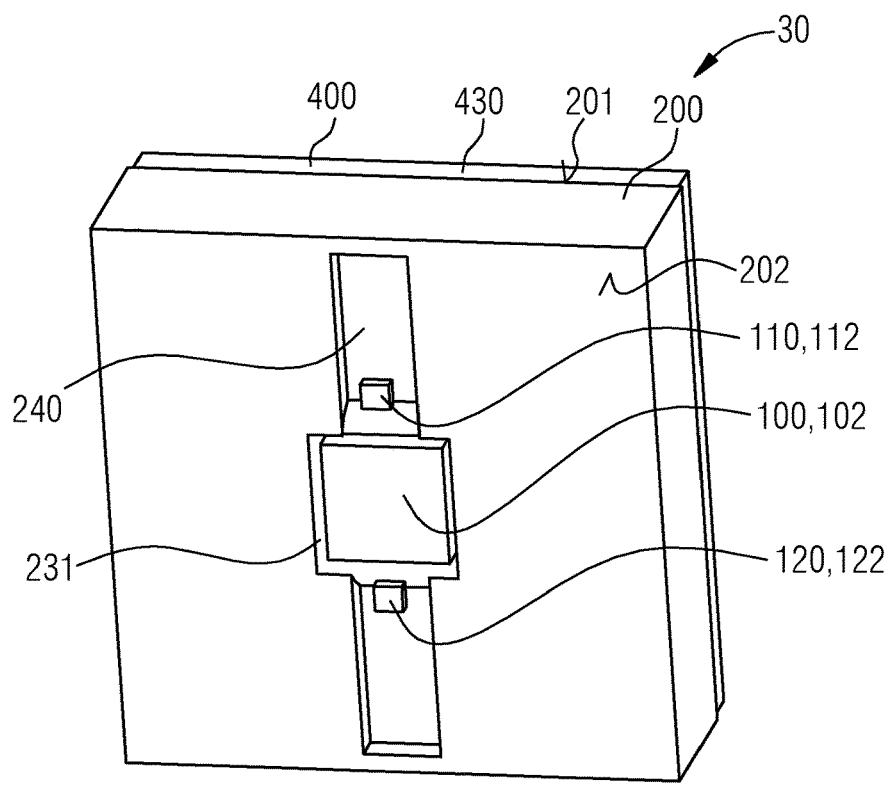
FIG. 7 schematically shows a rear view of parts of the optoelectronic component of the third example.
Figure 8:
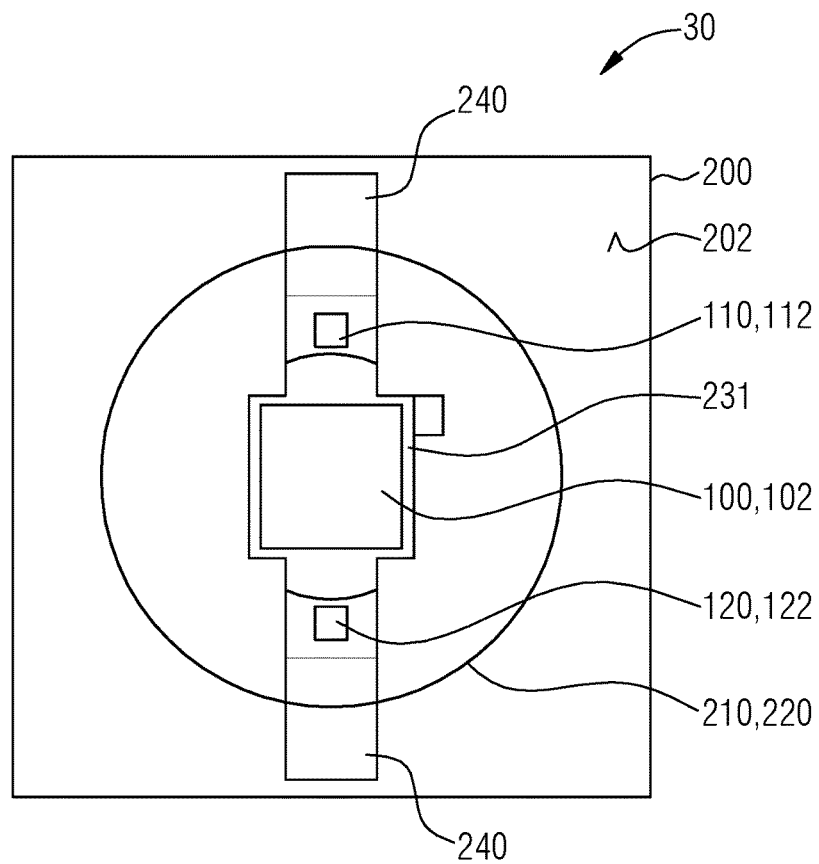
FIG. 8 schematically shows a partly transparent illustration of the optoelectronic component of the third example.

FIG. 6 shows a schematic perspective illustration of part of an optoelectronic component 30 in accordance with a third example. FIG. 7 shows a schematic illustration of a rear view of part of the optoelectronic component 30 of the third example. FIG. 8 shows, in a schematic illustration, a partly transparent plan view of the optoelectronic component 30 of the third example. The optoelectronic component 30 of the third example largely corresponds to the optoelectronic component 10 of the first example and the optoelectronic component 20 of the second example. Mutually corresponding component parts are provided with the same reference signs in all the figures. Only the differences between the optoelectronic component 30 of the third example and the optoelectronic components 10, 20 of the first and second examples are explained below. For the rest, the above description also applies to the optoelectronic component 30 in FIGS. 6 to 8.

The optical lens 400 of the optoelectronic component 30 is not illustrated in FIG. 6. The carrier 300 is absent in the illustration in FIG. 7. Both the carrier 300 and the optical lens 400 are absent in the illustration in FIG. 8.

Besides the first optoelectronic semiconductor chip 100 that emits light comprising a wavelength from the infrared spectral range, the optoelectronic component 30 comprises the second optoelectronic semiconductor chip 110 and the third optoelectronic semiconductor chip 120, each configured to emit light comprising a wavelength from the visible spectral range. However, it would also be possible to dispense with the third optoelectronic semiconductor chip 120. No optical waveguides 510, 520 and no deflection elements 420 are provided in the optoelectronic component 30.

In the optoelectronic component 30 of the third example, the reflector body 200 comprises a channel-shaped recess 240 at its underside 202. The channel-shaped recess 240 constitutes an elongate depression at the underside 202 of the reflector body 200. In this example, the channel-shaped recess 240 extends on both sides of the first perforation 231 and across the first perforation 231, such that the first perforation 231 extends to the channel-shaped recess 240.

In the optoelectronic component 30 of the third example, the second optoelectronic semiconductor chip 110 and the third optoelectronic semiconductor chip 120 are arranged at the top side 301 of the carrier 300 below the reflector body 200 such that the underside 202 of the reflector body 200 is arranged above the top sides 111, 121 of the second optoelectronic semiconductor chip 110 and the third optoelectronic semiconductor chip 120. The second optoelectronic semiconductor chip 110 and the third optoelectronic semiconductor chip 120 are each arranged in the channel-shaped recess 240 of the reflector body 200. In this example, the second optoelectronic semiconductor chip 110 is arranged laterally on one side next to the first optoelectronic semiconductor chip 100 and the third optoelectronic semiconductor chip 120 is arranged laterally on the other side next to the first optoelectronic semiconductor chip 100 such that the first optoelectronic semiconductor chip 100 is arranged between the second optoelectronic semiconductor chip 110 and the third optoelectronic semiconductor chip 120.

In the optoelectronic component 30, light emitted by the second optoelectronic semiconductor chip 110 and the third optoelectronic semiconductor chip 120 and comprising a wavelength from the visible spectral range may pass through the channel-shaped recess 240 and via the first perforation 231 into the cavity 210 of the reflector body 200 and mix there with the light emitted by the first optoelectronic semiconductor chip 100 and comprising a wavelength from the infrared spectral range. It is expedient if the second optoelectronic semiconductor chip 110 and the third optoelectronic semiconductor chip 120 are configured as volume emitting semiconductor chips.

Figure 9:
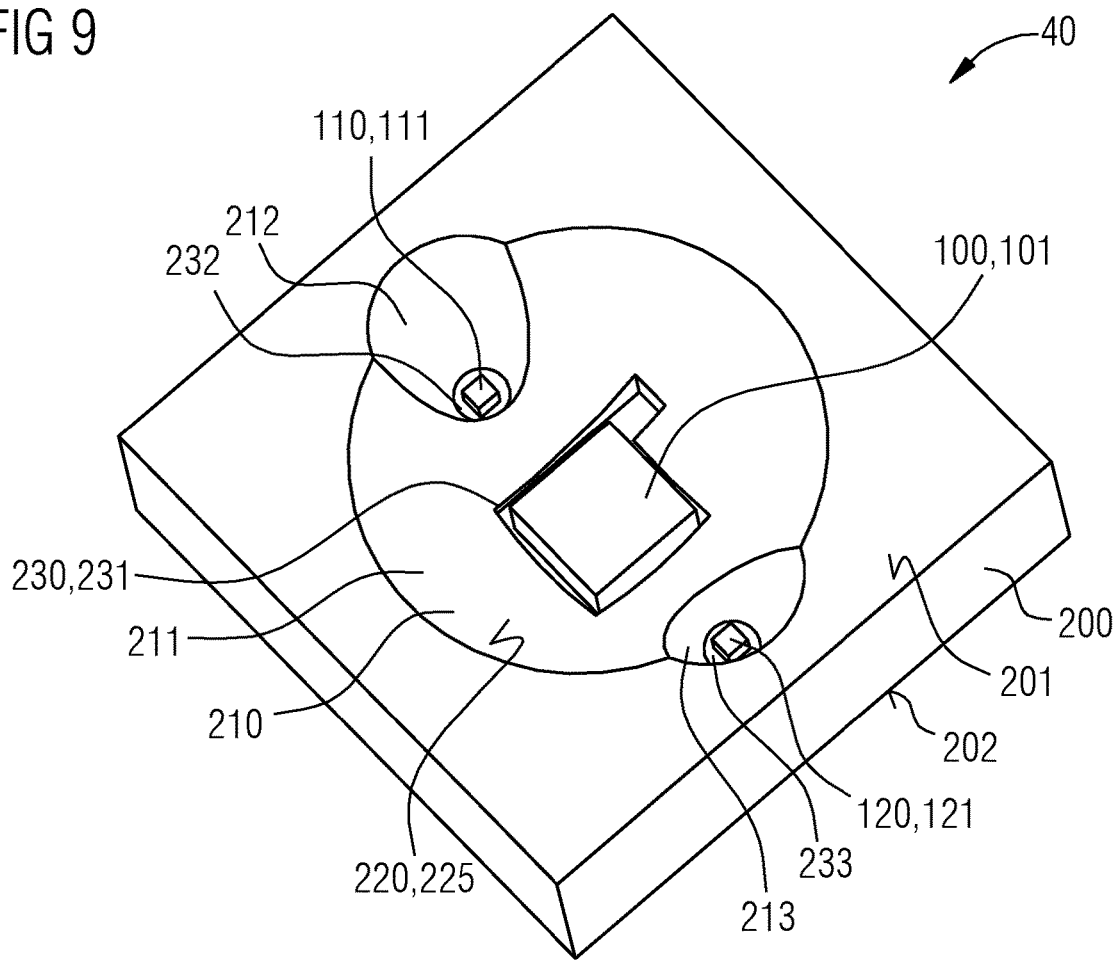
FIG. 9 schematically shows a perspective illustration of parts of an optoelectronic component in accordance with a fourth example.

FIG. 9 shows a schematic perspective illustration of an optoelectronic component 40 in accordance with a fourth example. The optoelectronic component 40 of the fourth example comprises correspondences to the optoelectronic components 10, 20, 30 of the examples described above. Corresponding component parts in FIG. 9 are provided with the same reference signs as in FIGS. 1 to 8. Only the deviating features of the optoelectronic component 40 are described below. For the rest, the above description of the optoelectronic components 10, 20, 30 also applies to the optoelectronic component 40 of the fourth example.

The optical lens 400 of the optoelectronic component 40 is not shown in the illustration in FIG. 9, for the sake of clarity.

Besides the first optoelectronic semiconductor chip 100 that emits light comprising a wavelength from the infrared spectral range, the optoelectronic component 40 also comprises the second optoelectronic semiconductor chip 110 and the third optoelectronic semiconductor chip 120, each configured to emit light comprising a wavelength from the visible spectral range. In a simplified example, the third optoelectronic semiconductor chip 120 may be omitted. Neither optical waveguides 510, 520 nor a channel-shaped recess 240 at the underside 202 of the reflector body 200 are provided in the optoelectronic component 40. Deflection elements 420 are not provided either in the optoelectronic component 40.

Instead, the cavity 210 of the reflector body 200 in the optoelectronic component 40 comprises a first section 211, a second section 212 and a third section 213. The first section 211, the second section 212 and the third section 213 of the cavity 210 widen in a funnel-shaped fashion toward the top side 201 of the reflector body 200.

In this example, the first section 211, the second section 212 and the third section 213 of the cavity 210 are partly superimposed on one another such that the combined volume of the first section 211, of the second section 212 and of the third section 213 together constitutes the continuous volume of the cavity 210. In this example, the first section 211 is arranged between the second section 212 and the third section 213.

In addition to the first perforation 231, the reflector body 200 comprises a second perforation 232 and a third perforation 233. The first perforation 231 is arranged at the bottom 230, that is to say in the base region, of the first section 211 of the cavity 210. The second perforation 232 is arranged at the bottom 230 of the second section 212 of the cavity 210. The third perforation 232 is arranged at the bottom 230 of the third section 213 of the cavity 210.

The first optoelectronic semiconductor chip 100, the second optoelectronic semiconductor chip 110 and the third optoelectronic semiconductor chip 120 are each arranged at the top side 310 of the carrier 300 such that the undersides 102, 112, 122 of the optoelectronic semiconductor chips 100, 110, 120 face the top side 301 of the carrier 300. In this example, the first optoelectronic semiconductor chip 100 is arranged in the first perforation 231 of the reflector body 200. The second optoelectronic semiconductor chip 110 is arranged in the second perforation 232 of the reflector body 200. The third optoelectronic semiconductor chip 120 is arranged in the third perforation 232 of the reflector body 200. By virtue of this arrangement of the optoelectronic semiconductor chips 100, 110, 120, the light emitted by the first optoelectronic semiconductor chip 100 and comprising a wavelength from the infrared spectral range, in the optoelectronic component 40, may mix in the cavity 210 with the light emitted by the second optoelectronic semiconductor chip 110 and the third optoelectronic semiconductor chip 120 and comprising a wavelength from the visible spectral range.

It is expedient if the second optoelectronic semiconductor chip 110 and the third optoelectronic semiconductor chip 120 are configured as volume emitting semiconductor chips.

Figure 10:
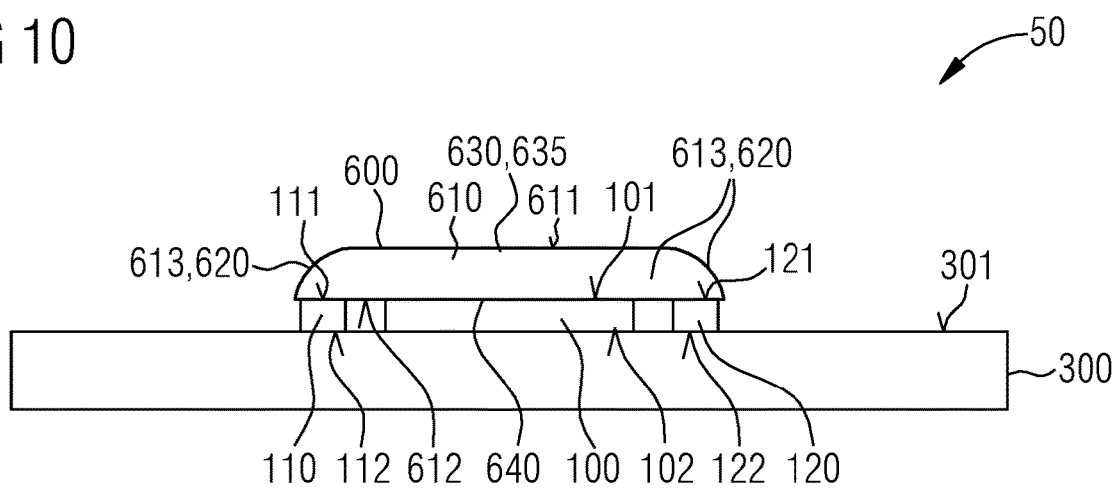
FIG. 10 schematically shows a schematic sectional side view of parts of an optoelectronic component in accordance with a fifth example.
Figure 11:
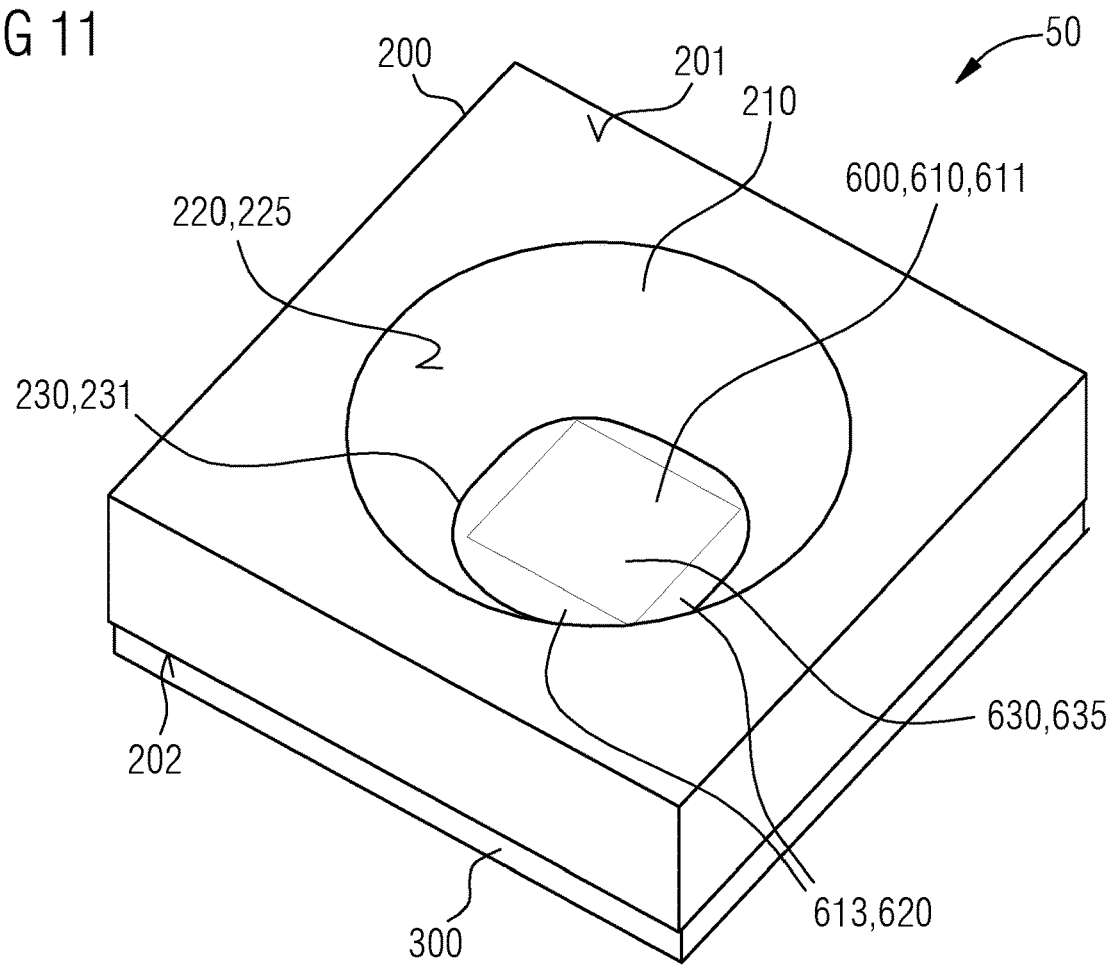
FIG. 11 schematically shows a perspective illustration of parts of the optoelectronic component of the fifth example.

FIG. 10 shows a schematic sectional side view of part of an optoelectronic component 50 in accordance with a fifth example. FIG. 11 shows a schematic perspective illustration of part of the optoelectronic component 50 of the fifth example. The optoelectronic component 50 of the fifth example comprises correspondences to the optoelectronic components 10, 20, 30, 40 described above. Corresponding component parts in FIGS. 10 and 11 are provided with the same reference signs as in FIGS. 1 to 9. Only the deviations of the optoelectronic component 50 of the fifth example from the optoelectronic components 10, 20, 30, 40 of the examples described above are explained below. For the rest, the description above also applies to the optoelectronic component 50.

The reflector body 200 and the optical lens 400 are not shown in the schematic illustration in FIG. 10. The optical lens 400 is not illustrated in FIG. 11 either, for the sake of clarity.

In the optoelectronic component 50, no optical waveguides 510, 520 and no deflection elements 420 are provided. The reflector body 200 comprises neither a recess 250 nor a channel-shaped recess 240. The cavity 210 is not subdivided into a plurality of sections 211, 212, 213. Only the first perforation 231 is provided.

In the optoelectronic component 50, an optical element 600 is provided and arranged in the cavity 210 such that light emitted by the first optoelectronic semiconductor chip 100 and comprising a wavelength from the infrared spectral range and light emitted by the second optoelectronic semiconductor chip 110 and the third optoelectronic semiconductor chip 120 and comprising a wavelength from the visible spectral range at least partly pass into the optical element 600. In this example, the optical element 600 brings about a mixing of the light emitted by the first optoelectronic semiconductor chip 100 with the visible light emitted by the second optoelectronic semiconductor chip 110 and the third optoelectronic semiconductor chip 120.

The optical element 600 comprises a light-transmissive body 610 comprising a top side 611, an underside 612 opposite the top side 611, and a plurality of side faces 613 extending between the top side 611 and underside 612. The mixing of the light emitted by the first optoelectronic semiconductor chip 100 and comprising a wavelength from the infrared spectral range and the light emitted by the second optoelectronic semiconductor chip 110 and the third optoelectronic semiconductor chip 120 and comprising a wavelength from the visible spectral range is carried out within the light-transmissive body 610 of the optical element 600 by single or multiple internal reflection at the outer faces of the light-transmissive body 610. The light-transmissive body 610 may comprise, for example, a glass or a transparent plastic.

In the example shown in FIGS. 10 and 11, both the first optoelectronic semiconductor chip 100 and the second optoelectronic semiconductor chip 110 and the third optoelectronic semiconductor chip 120 are arranged at the top side 301 of the carrier 300 in the first perforation 231 of the reflector body 200. In this example, the first optoelectronic semiconductor chip 100 is arranged between the second optoelectronic semiconductor chip 110 and the third optoelectronic semiconductor chip 120. The light-transmissive body 610 of the optical element 600 is arranged above the first optoelectronic semiconductor chip 100, the second optoelectronic semiconductor chip 110 and the third optoelectronic semiconductor chip 120 such that the underside 612 of the light-transmissive body 610 faces the top sides 101, 111, 121 of the optoelectronic semiconductor chips 100, 110, 120.

Light emitted by the first optoelectronic semiconductor chip 100, the second optoelectronic semiconductor chip 110 and the third optoelectronic semiconductor chip 120 may pass into the light-transmissive body 610 of the optical element 600 through the underside 612 of the light-transmissive body 610. The light emitted by the first optoelectronic semiconductor chip 100 and comprising a wavelength from the infrared spectral range is radiated into the light-transmissive body 610 in a central region of the light-transmissive body 610. The light emitted by the second optoelectronic semiconductor chip 110 and the third optoelectronic semiconductor chip 120 and comprising a wavelength from the visible spectral range is radiated into the light-transmissive body 610 in edge regions of the light-transmissive body 610.

In the example shown in FIGS. 10 and 11, the side faces 613 of the light-transmissive body 610 are chamfered such that light radiated into the light-transmissive body 610 from the second optoelectronic semiconductor chip 110 and from the third optoelectronic semiconductor chip 120 is reflected internally at the side faces 613 of the light-transmissive body 610 and deflected in the direction of the center of the light-transmissive body 610. For this purpose, the side faces 613 may additionally comprise, at least in sections, a reflective coating 620, for example, a coating comprising silver, aluminum or gold.

The light radiated into the light-transmissive body 610 may be coupled out at the top side 611 of the light-transmissive body 610 of the optical element 600. To support the coupling-out, the light-transmissive body 610 may comprise an upper microstructuring 630 at its top side 611. The upper microstructuring 630 may comprise, for example, a plurality of microlenses 635. The microlenses 635 may be configured, for example, in a regular two-dimensional matrix arrangement at the top side 611 of the light-transmissive body 610. Each microlens 635 may comprise a size of 15 µm×15 µm, for example, in the plane of the top side 611.

The underside 612 of the light-transmissive body 610 may comprise a lower microstructuring 640 which, as a sputtering structure, supports an intermixing of the light emitted by the first optoelectronic semiconductor chip 100 and the light emitted by the second optoelectronic semiconductor chip 110 and the third optoelectronic semiconductor chip 120 in the light-transmissive body 610 of the optical element 600.

The light-transmissive body 610 of the optical element 600 may be arranged only above the first optoelectronic semiconductor chip 100, wherein the underside 612 of the light-transmissive body faces the top side 101 of the first optoelectronic semiconductor chip 100. The second optoelectronic semiconductor chip 110 and the third optoelectronic semiconductor chip 120 are arranged laterally next to the light-transmissive body 610 such that radiation emission sides of the second optoelectronic semiconductor chip 110 and the third optoelectronic semiconductor chip 120 face side faces 613 of the light-transmissive body 610, that is to say that light emitted by the second optoelectronic semiconductor chip 110 and the third optoelectronic semiconductor chip 120 and comprising a wavelength from the visible spectral range may pass into the light-transmissive body 610 through side faces 613 of the light-transmissive body 610. In this example of the optoelectronic component 50, too, an intermixing of the light emitted by the second optoelectronic semiconductor chip 110 and the third optoelectronic semiconductor chip 120 with the light emitted by the first optoelectronic semiconductor chip 100 is carried out in the light-transmissive body 610 of the optical element 600. The intermixed light may in turn emerge at the top side 611 of the light-transmissive body 610.

In the example of the optoelectronic component comprising the optical element 600, the third optoelectronic semiconductor chip 120 may be omitted in simplified variants.

Figure 12:
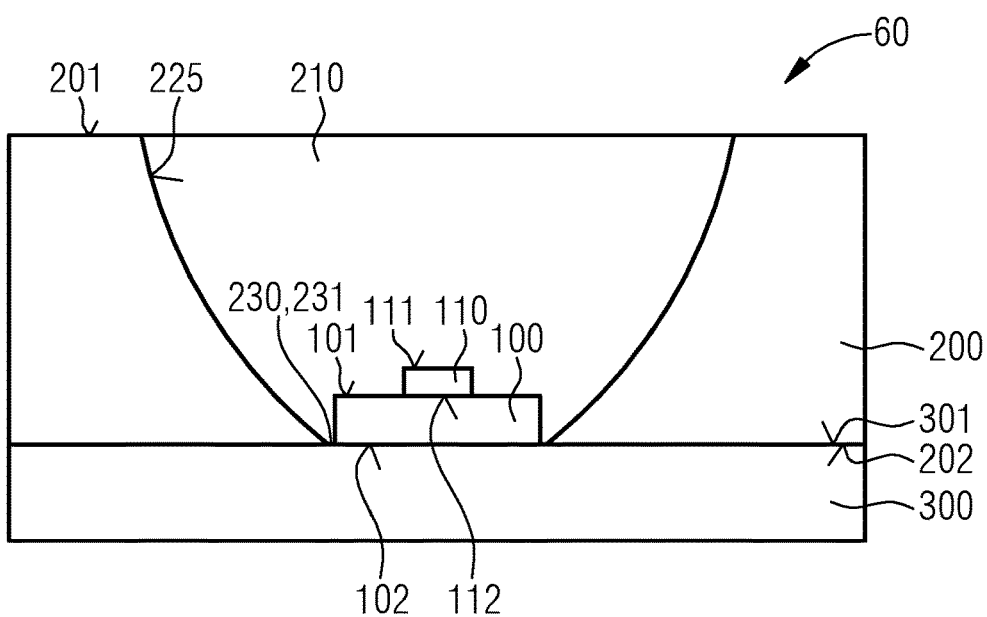
FIG. 12 schematically shows a sectional side view of an optoelectronic component in accordance with a sixth example.

FIG. 12 shows a schematic sectional side view of an optoelectronic component 60 in accordance with a sixth example. The optoelectronic component 60 of the sixth example comprises correspondences to the optoelectronic components 10, 20, 30, 40, 50 described above. Corresponding component parts in FIG. 12 are provided with the same reference signs as in FIGS. 1 to 11. A description is given below only of those aspects and features in respect of which the optoelectronic component 60 deviates from the optoelectronic components 10, 20, 30, 40, 50 described above. For the rest, the above description of the optoelectronic components 10, 20, 30, 40, 50 also applies to the optoelectronic component 60 of the sixth example as shown in FIG. 12.

The optical lens 400 of the optoelectronic component 60 is not shown in the illustration in FIG. 12, for the sake of clarity. However, the optical lens 400 may also be present in the optoelectronic component 60. The optical lens 400 may also be omitted, however, in the optoelectronic component 60.

In the optoelectronic component 60, the first optoelectronic semiconductor chip 100 is arranged at the bottom 230 of the cavity 210 of the reflector body 200 in the first perforation 231 of the reflector body 200 at the top side 301 of the carrier 300. In this example, the underside 102 of the first optoelectronic semiconductor chip 100 faces the top side 301 of the carrier 300. The second optoelectronic semiconductor chip 110 is arranged on the top side 101 of the first optoelectronic semiconductor chip 100. In this example, the underside 112 of the second optoelectronic semiconductor chip 110 faces the top side 101 of the first optoelectronic semiconductor chip 100. The top side 101 of the first optoelectronic semiconductor chip 100 and the top side 111 of the second optoelectronic semiconductor chip 110 thus face in the same spatial direction as the top side 301 of the carrier 300.

The first optoelectronic semiconductor chip 100 and the second optoelectronic semiconductor chip 110 are electrically contacted in a manner not illustrated in detail in FIG. 12. By way of example, the first optoelectronic semiconductor chip 100 and the second optoelectronic semiconductor chip 110 may electrically conductively connect to electrical contact pads arranged at the top side 301 of the carrier 300 by bond wires or soldering contacts.

It is expedient for the second optoelectronic semiconductor chip 110 to be at least partly transparent to light emitted by the first optoelectronic semiconductor chip 100 and comprising a wavelength from the infrared spectral range. In this example, light emitted by the first optoelectronic semiconductor chip and comprising a wavelength from the infrared spectral range is not shaded or only partly shaded by the second optoelectronic semiconductor chip 110. For this purpose, the second optoelectronic semiconductor chip 110 must be formed from materials which at least do not completely reflect or absorb the light emitted by the first optoelectronic semiconductor chip 100.

In the optoelectronic component 60 of the sixth example shown in FIG. 12, the second optoelectronic semiconductor chip 110 arranged on the top side 101 of the first optoelectronic semiconductor chip 100 comprises a smaller size than the first optoelectronic semiconductor chip 100. This means that the top side 111 and the underside 112 of the second optoelectronic semiconductor chip 110 each comprise a smaller area than the top side 101 and the underside 102 of the first optoelectronic semiconductor chip 100. As a result, the underside 112 of the second optoelectronic semiconductor chip 110 only partly covers the top side 101 of the first optoelectronic semiconductor chip 100. What is achieved by this means, too, is that the second optoelectronic semiconductor chip 110 does not shade or only partly shades light emitted by the first optoelectronic semiconductor chip 100, even if the second optoelectronic semiconductor chip 110 is arranged on a light-emitting section of the top side 101 of the first optoelectronic semiconductor chip 100. It is also possible for the second optoelectronic semiconductor chip 110 to cover only a non-light-emitting section of the top side 101 of the first optoelectronic semiconductor chip 100.

Alternatively, it is also possible for the second optoelectronic semiconductor chip 110 arranged on the top side 101 of the first optoelectronic semiconductor chip 100 to be of exactly the same size as the first optoelectronic semiconductor chip 100 or even larger than the first optoelectronic semiconductor chip 100. In this example, it is expedient for the second optoelectronic semiconductor chip 110 to be at least partly transparent to light emitted by the first optoelectronic semiconductor chip 100.

In addition to the second optoelectronic semiconductor chip 110, a third optoelectronic semiconductor chip configured to emit light comprising a wavelength from the visible spectral range might also be arranged on the top side 101 of the first optoelectronic semiconductor chip 100 of the optoelectronic component 60.

In the optoelectronic component 60 of the sixth example as illustrated in FIG. 12, the second optoelectronic semiconductor chip 110 emitting light comprising a wavelength from the visible spectral range is arranged on the top side 101 of the first optoelectronic semiconductor chip 100 emitting light comprising a wavelength from the infrared spectral range. In a further example, the first optoelectronic semiconductor chip 100 emitting light comprising a wavelength from the infrared spectral range is conversely arranged on the top side 111 of the second optoelectronic semiconductor chip 110 emitting light comprising a wavelength from the visible spectral range. In this example, it is expedient for the first optoelectronic semiconductor chip 100 to comprise a smaller size than the second optoelectronic semiconductor chip 110. Moreover, in this example, it is expedient for the first optoelectronic semiconductor chip 100 to be at least partly transparent to light emitted by the second optoelectronic semiconductor chip 110 and comprising a wavelength from the visible spectral range.

In a further example, the optoelectronic component is configured like the optoelectronic component 40 of the fourth example as described with reference to FIG. 9. However, the optoelectronic component in this example does not comprise a carrier 300. The reflector body 200 does not comprise perforations 231, 232, 233 at the bottom 230 of the cavity 210. Instead, the cavity 210 of the reflector body 200 is closed at the bottom 230. The optoelectronic semiconductor chips 100, 110, 120 are each arranged at the bottom 230 of the cavity 210 of the reflector body 200 and electrically contacted there. In this optoelectronic component, the reflector body 200 may be produced, for example, by the method of MID technology.

In a further example, the optoelectronic component is configured like the optoelectronic component 50 described with reference to FIGS. 10 and 11. However, no carrier 300 is present in this optoelectronic component. The reflector body 200 does not comprise a first perforation 231 in this optoelectronic component such that the cavity 210 of the reflector body 200 is closed at the bottom 230 of the cavity. In this optoelectronic component, the optoelectronic semiconductor chips 100, 110, 120 are arranged at the bottom 230 of the cavity 210 of the reflector body 200 and electrically contacted there. In this example, too, the reflector body 200 may be produced, for example, by the MID method.

The optoelectronic component may be configured like the optoelectronic component 60 described with reference to FIG. 12. However, no carrier 300 is present in this optoelectronic component. The reflector body 200 does not comprise a first perforation 231 in this optoelectronic component such that the cavity 210 of the reflector body 200 is closed at the bottom 230 of the cavity. In this optoelectronic component, the first optoelectronic semiconductor chip 100 is arranged at the bottom 230 of the cavity 210 of the reflector body 200. The second optoelectronic semiconductor chip 110 is arranged on the top side 101 of the first optoelectronic semiconductor chip 100. In this optoelectronic component, the first optoelectronic semiconductor chip 100 and the second optoelectronic semiconductor chip 110 are electrically contacted at the bottom 230 of the cavity 210. The reflector body 200 may be produced, for example, by the method of MID technology.

During operation of the optoelectronic components 10, 20, 30, 40, 50, 60, the first optoelectronic semiconductor chip 100 may each be operated in pulsed operation, that is to say may be switched on and off repeatedly. By way of example, differential measurements of a reflection signal may be made possible as a result.

To visually mask the light emitted by the first optoelectronic semiconductor chip 100 and comprising a wavelength from the infrared spectral range, it is expedient to operate the second optoelectronic semiconductor chip 110 and, if present, the third optoelectronic semiconductor chip 120 in continuous operation during operation of the optoelectronic components 10, 20, 30, 40, 50, 60.

Alternatively, it is possible to operate the second optoelectronic semiconductor chip 110 and, if present, the third optoelectronic semiconductor chip 120 in pulsed operation that is anticyclic with respect to the pulsed operation of the first optoelectronic semiconductor chip 100. In this example, the second optoelectronic semiconductor chip 110 and the third optoelectronic semiconductor chip 120 are switched on precisely when the first optoelectronic semiconductor chip 100 is switched off, and are switched off precisely when the first optoelectronic semiconductor chip 100 is switched on. In this mode of operation, therefore, there is always light emission by either the first optoelectronic semiconductor chip 100 or the second optoelectronic semiconductor chip 110. Particularly if the light emitted by the second optoelectronic semiconductor chip 110 and, if present, the third optoelectronic semiconductor chip 120 comprises a similar brightness to the perceptible light emitted by the first optoelectronic semiconductor chip 100 and comprising a wavelength from the infrared spectral range, an effective visual masking is achieved in this mode of operation, too. One advantage of such pulsed operation of the second optoelectronic semiconductor chip 110 and the third optoelectronic semiconductor chip 120 consists of a reduced energy consumption in comparison to continuous operation.

Our components and methods have been illustrated and described in greater detail on the basis of the preferred examples. Nevertheless, this disclosure is not restricted to the examples disclosed. Rather, other variations may be derived therefrom by those skilled in the art, without departing from the scopes of protection of the appended claims.

This application claims priority of DE 10 2016 117 523.4, the subject matter of which is incorporated herein by reference.

The invention claimed is:

1. An optoelectronic component comprising:
a first optoelectronic semiconductor chip configured to emit light comprising a wavelength from an infrared spectral range, and
a second optoelectronic semiconductor chip configured to emit light comprising a wavelength from a visible spectral range, wherein
the optoelectronic component comprises a reflector body comprising a top side and an underside,
the reflector body comprises a cavity opened toward the top side,
a wall of the cavity constitutes a reflector,
the first optoelectronic semiconductor chip is arranged at a bottom of the cavity,
wherein the optoelectronic component comprises an optical element arranged in the cavity such that light emitted by the first optoelectronic semiconductor chip and light emitted by the second optoelectronic semiconductor chip at least partly pass into the optical element, and the optical element is configured to mix light emitted by the first optoelectronic semiconductor chip and light emitted by the second optoelectronic semiconductor chip, and
the optical element comprises a light-transmissive body comprising a top side and an underside, wherein a reflective coating is arranged at least in sections at side faces of the light-transmissive body extending between the top side and the underside.

2. The optoelectronic component according to claim 1, wherein the reflector body comprises, at the bottom of the cavity, a first perforation extending between the underside of the reflector body and the cavity, and the first optoelectronic semiconductor chip is arranged in the first perforation.

3. The optoelectronic component according to claim 2, wherein the optoelectronic component comprises a carrier, the reflector body is arranged on the carrier such that the underside of the reflector body faces the carrier, and the first optoelectronic semiconductor chip is arranged on the carrier.

4. The optoelectronic component according to claim 1, wherein the cavity widens in funnel-shaped fashion toward the top side of the reflector body.

5. The optoelectronic component according to claim 1, wherein the optoelectronic component comprises an optical lens arranged at the top side of the reflector body.

6. The optoelectronic component according to claim 5, wherein the optical lens comprises a conical lens section extending into the cavity of the reflector body.

7. The optoelectronic component according to claim 1, wherein the cavity comprises a first section widening in a funnel-shaped fashion toward the top side of the reflector body, and a second section widening in a funnel-shaped fashion toward the top side of the reflector body, the first section and the second section are superimposed on one another, and the first perforation is arranged at the bottom of the first section of the cavity and the second perforation is arranged at the bottom of the second section of the cavity.

8. The optoelectronic component according to claim 1, wherein the top side of the light-transmissive body comprises a micro structuring.

9. The optoelectronic component according to claim 8, wherein the microstructuring comprises a plurality of microlenses.

10. The optoelectronic component according to claim 1, wherein the underside of the light-transmissive body comprises a microstructuring.

11. The optoelectronic component according to claim 1, wherein the second optoelectronic semiconductor chip is arranged at the bottom of the cavity, the light-transmissive body is arranged above the first optoelectronic semiconductor chip and above the second optoelectronic semiconductor chip, and the underside of the light-transmissive body faces the first optoelectronic semiconductor chip and the second optoelectronic semiconductor chip.

12. The optoelectronic component according to claim 1, the light-transmissive body is arranged above the first optoelectronic semiconductor chip, the underside of the light-transmissive body faces the first optoelectronic semiconductor chip, the second optoelectronic semiconductor chip is arranged laterally next to the light-transmissive body, and a radiation emission side of the second optoelectronic semiconductor chip faces a side face of the light-transmissive body.

13. The optoelectronic component according to claim 1, wherein the second optoelectronic semiconductor chip is configured as a volume emitting semiconductor chip.

14. The optoelectronic component according to claim 1, wherein the second optoelectronic semiconductor chip is configured to emit light comprising a wavelength from a red spectral range.

15. The optoelectronic component according to claim 1, wherein the optoelectronic component comprises a third optoelectronic semiconductor chip configured to emit light comprising a wavelength from a visible spectral range.

16. A method of operating the optoelectronic component according to claim 1, comprising operating the first optoelectronic semiconductor chip in a pulsed operation, and operating the second optoelectronic semiconductor chip in a continuous operation or pulsed operation that is anticyclic with respect to the pulsed operation of the first optoelectronic semiconductor chip.

* * * * *